United States Patent
Lee et al.

(10) Patent No.: US 12,111,368 B2
(45) Date of Patent: Oct. 8, 2024

(54) FUSE LIFE EXPECTANCY PREDICTION DEVICE FOR ELECTRIC VEHICLE BATTERY AND PREDICTION METHOD THEREOF

(71) Applicants: HYUNDAI MOTOR COMPANY, Seoul (KR); KIA CORPORATION, Seoul (KR)

(72) Inventors: Bo Seon Lee, Seoul (KR); Kyung Ho Kim, Ansan-si (KR); Beom Joo Kwon, Suwon-si (KR); Hui Tae Yang, Cheonan-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 155 days.

(21) Appl. No.: 17/870,034

(22) Filed: Jul. 21, 2022

(65) Prior Publication Data
US 2023/0152392 A1    May 18, 2023

(30) Foreign Application Priority Data

Nov. 18, 2021    (KR) .................. 10-2021-0159436

(51) Int. Cl.
G01R 31/74    (2020.01)
G01R 31/28    (2006.01)

(52) U.S. Cl.
CPC ......... G01R 31/74 (2020.01); G01R 31/2849 (2013.01)

(58) Field of Classification Search
None
See application file for complete search history.

(56) References Cited

U.S. PATENT DOCUMENTS

| | | | |
|---|---|---|---|
| 9,851,393 B2* | 12/2017 | Fan | G01R 31/74 |
| 11,892,522 B2* | 2/2024 | Surve | H02H 3/046 |
| 2013/0241567 A1* | 9/2013 | Boehm | B60L 50/52 |
| | | | 324/434 |
| 2016/0299186 A1* | 10/2016 | Fan | G01R 31/74 |
| 2016/0341777 A1* | 11/2016 | Liu | G01R 31/007 |
| 2018/0164364 A1* | 6/2018 | Smith | G07C 5/0825 |
| 2023/0160977 A1* | 5/2023 | Surve | G01R 31/74 |
| | | | 324/550 |
| 2024/0125870 A1* | 4/2024 | Surve | H02H 3/044 |

FOREIGN PATENT DOCUMENTS

| | | |
|---|---|---|
| CN | 201654166 U | 11/2010 |
| JP | 2007-43860 A | 2/2007 |
| KR | 20-1995-0027245 U | 10/1995 |
| KR | 2018-0107242 A | 10/2018 |
| KR | 2021-0080885 A | 7/2021 |
| WO | 2017/078884 A1 | 5/2017 |

* cited by examiner

Primary Examiner — Jermele M Hollington
(74) Attorney, Agent, or Firm — MCDONNELL BOEHNEN HULBERT & BERGHOFF LLP

(57) ABSTRACT

A device for predicting a life expectancy of a fuse for a battery of an electric vehicle may include a sensor configured to generate and output current information about current flowing in the fuse, a processor, and a memory connected to the processor and configured to store a preset lookup table, the memory storing program instructions which are executable by the processor to generate fuse-life expectancy information corresponding to the fuse based on the lookup table and time corresponding to an excess when the current information exceeds a preset threshold value.

14 Claims, 9 Drawing Sheets

① current pattern #1

→ temperature change #1

→ Element exothermic characteristics #1

② current pattern #2

→ temperature change #2

→ Element exothermic characteristics #2

$$N \propto \frac{K}{(T_{avg})^n (\Delta T)^m}$$

** where, k/n/m are parameters related to durability of fuse

FIG. 6

| time<br>current | 0.1 | 1 | 10 | 100 | 1000 |
|---|---|---|---|---|---|
| 1600A | 10 | 100 | 1000 | 10000 | 50000 |
| 800A | 0 | 10 | 100 | 500 | 1000 |
| 400A | 0 | 0 | 0 | 10 | 50 |
| 200A | 0 | 0 | 0 | 0 | 0 |

FIG. 7

| current | POINT(points) | | | | | | | | |
|---|---|---|---|---|---|---|---|---|---|
| | 0.001sec | 0.001sec | 0.1sec | 1sec | 10sec | 0.001sec | 100sec | 500sec | 1000sec |
| 1200A | 0 | 90 | 8300 | 100000 | 1000000 | 1000000 | 1000000 | 1000000 | 1000000 |
| 800A | 0 | 1 | 100 | 1100 | 12500 | 100000 | 200000 | 1000000 | 1000000 |
| 600A | 0 | 0 | 3 | 100 | 1000 | 5000 | 10000 | 100000 | 1000000 |
| 400A | 0 | 0 | 0 | 1 | 10 | 30 | 80 | 1000 | 1400 |
| 200A | 0 | 0 | 0 | 0 | 0 | 0 | 0 | 0 | 0 |
| 200A ↓ | | | | | | | | | |

FUSE LIFE EXPECTANCY PREDICTION DEVICE FOR ELECTRIC VEHICLE BATTERY AND PREDICTION METHOD THEREOF

CROSS REFERENCE TO RELATED APPLICATIONS

The present application claims priority to Korean Patent Application No. 10-2021-0159436, filed Nov. 18, 2021, the entire contents of which is incorporated herein for all purposes by this reference.

BACKGROUND

Field

The present disclosure relates to a device and method for predicting a life expectancy of a fuse used in an electric vehicle battery.

Description of the Related Art

An electric vehicle refers to a vehicle using a battery engine that operates with electrical energy output from a battery. Such an electric vehicle has advantages of emitting no exhaust gas and being very quiet because it employs a chargeable and dischargeable battery as a main power source.

In the electric vehicle, a fuse is provided in a battery circuit and serves to protect the battery circuit from a short-circuit current when the circuit is short circuited in the abnormal state. The durability of the fuse is affected depending on how much and how long the current has passed in the fuse. In general, the more and the longer the current flows in the fuse, the lower the performance of the fuse is. In other words, the performance of the fuse is degraded with an increase in the number of times and time that a large amount of current flows in the fuse.

When the performance of the fuse is degraded, the fuse may blow out even in a normal current region where the battery circuit normally operates. In other words, the fuse, of which the performance is degraded, may blow out and interfere with the normal operation of the electric vehicle even though the battery circuit is not in an overcurrent.

To increase the durability of the fuse, if the fuse is designed to a superior specification, costs may increase significantly and the fuse may rather fall short of its duty because it does not work even in the overcurrent where the fuse should blow out to cut off the overcurrent.

Matters described as the related art are provided merely for promoting understanding for the background of the disclosure, and should not be taken as the prior art already known to a person having ordinary knowledge in the art.

SUMMARY

The disclosure is to provide a device and method for predicting a life expectancy of a fused formed in a battery circuit of an electric vehicle.

According to an embodiment of the disclosure, disclosed is a device for predicting a life expectancy of a fuse for a battery of an electric vehicle, the device including a sensor configured to generate and output current information about current flowing in the fuse, a processor, and a memory connected to the processor and configured to store a preset lookup table. The memory is storing program instructions which are executable by the processor to generate fuse-life expectancy information corresponding to the fuse based on the lookup table and time corresponding to an excess when the current information exceeds a preset threshold.

According to an embodiment, when the current information is driving current information, the memory may be configured to store program instructions for generating the fuse-life expectancy information based on a preset method by measuring a peak current and a peak time corresponding to the driving current information when the driving current information exceeds a preset driving threshold value, and the threshold value may be the driving threshold value.

According to an embodiment, the memory may be configured to store program instructions for cumulatively measuring the peak current and the peak time until the driving current information is lower than or equal to the driving threshold value, and generating the fuse-life expectancy information by looking up information corresponding to the cumulatively measured peak current and peak time from the lookup table.

According to an embodiment, when the current information is quick-charging current information, the memory may be configured to store program instructions for generating a quick-charging absolute current value corresponding to the quick-charging current information, and generating the fuse-life expectancy information based on a preset method by measuring a quick-charging current information and charging time when the quick-charging absolute current value exceeds a preset quick-charging threshold value, and the threshold value may be the quick-charging absolute current value.

According to an embodiment, the memory may be configured to store program instructions for cumulatively measuring the quick-charging current information and the charging time until the quick charging is completed, and generating the fuse-life expectancy information by looking up information corresponding to the cumulatively measured quick-charging current information and charging time from the lookup table.

According to an embodiment, the memory may be configured to further store program instructions for outputting a preset warning when the fuse-life expectancy information is lower than or equal to a preset warning reference.

According to an embodiment, the memory may be configured to store program instructions to detect a warning level of the fuse-life expectancy information, and output a warning corresponding to the warning level.

According to another embodiment of the disclosure, disclosed is a method of predicting a life expectancy of a fuse used for a battery of an electric vehicle in the fuse-life expectancy prediction device provided vehicle, the method including generating information about current flowing in the fuse, comparing the current information with a preset threshold value, and generating fuse-life expectancy information corresponding to the fuse based on a lookup table previously stored in a provided memory and time corresponding to an excess when the current information exceeds the threshold value.

According to an embodiment, when the current information is driving current information, the step of generating the fuse-life expectancy information may include: measuring a peak current and a peak time corresponding to the driving current information when the driving current information exceeds a preset driving threshold value; and generating the fuse-life expectancy information based on a preset method using the peak current and the peak time, and the threshold value may be the driving threshold value.

According to an embodiment, the step of generating the fuse-life expectancy information may include: cumulatively measuring the peak current and the peak time until the driving current information is lower than or equal to the driving threshold value; and generating the fuse-life expectancy information by looking up information corresponding to the cumulatively measured peak current and peak time from the lookup table.

According to an embodiment, when the current information is quick-charging current information, the step of generating the fuse-life expectancy information may include: generating a quick-charging absolute current value corresponding to the quick-charging current information; and generating the fuse-life expectancy information based on a preset method by measuring quick-charging current information and charging time when the quick-charging absolute current value exceeds a preset quick-charging threshold value, and the threshold value may be the quick-charging absolute current value.

According to an embodiment, the step of generating the fuse-life expectancy information may include: cumulatively measuring the quick-charging current information and the charging time until the quick charging is completed; and generating the fuse-life expectancy information by looking up information corresponding to the cumulatively measured quick-charging current information and charging time from the lookup table.

According to an embodiment, the fuse-life expectancy prediction method may further include outputting a preset warning when the fuse-life expectancy information is lower than or equal to a preset warning reference.

According to an embodiment, the outputting the warning may include: detecting a warning level of the fuse-life expectancy information; and outputting a warning corresponding to the warning level.

BRIEF DESCRIPTION OF THE FIGURES

FIG. 6 is a diagram illustrating a lookup table to describe operations of a fuse-life expectancy prediction device according to an embodiment of the disclosure.

FIG. 7 is a diagram illustrating a lookup table according to an embodiment of the disclosure.

DETAILED DESCRIPTION

Exemplary embodiments according to the technical ideas of the disclosure are provided to more completely describe the technical ideas of the disclosure to a person having ordinary knowledge in the art, and the embodiments set forth herein may be changed in various different forms and should not be construed as limiting the scope of the disclosure. Rather, these embodiments are provided so that the disclosure will be thorough and complete, and will fully convey the technical ideas of the disclosure to those skilled in the art.

It will be understood that, although the terms 'first,' 'second,' etc. may be used herein to describe various members, regions, layers, sections and/or elements, theses members, components, regions, layers, sections and/or elements should not be limited by these terms. These terms do not denote any order, quantity or importance, but rather are only used to distinguish one member, region, section, or element from another member, region, section or elements. Thus, a first member, region, section or element to be discussed below could also be termed a second member, region, section or element without departing from the teachings of the technical ideas of the disclosure. For example, a first element may be referred to as a second element without deviating from the scope of the example embodiment, and similarly, the second element may also be referred to as the first component.

Further, an 'electric vehicle' needs to be construed as a concept including various types of vehicles such as a motor driving vehicle, a fuel cell vehicle, a hybrid vehicle, and the like to be driven by electric power.

Unless otherwise defined, all terms used herein include technical and scientific terms and have the same meaning as commonly understood by a person having ordinary knowledge in the art to which the concept of the disclosure pertains. It will be further understood that terms, such as those defined in commonly used dictionaries, should be interpreted as having a meaning that is consistent with their meaning in the context of the relevant art and will not be interpreted in an overly formal sense unless explicitly defined herein.

As used herein, the term 'and/or' includes any and all combinations of one or more of the mentioned elements.

Below, embodiments according to the technical ideas of the disclosure will be described in detail with reference to the accompanying drawings.

Figure 1:
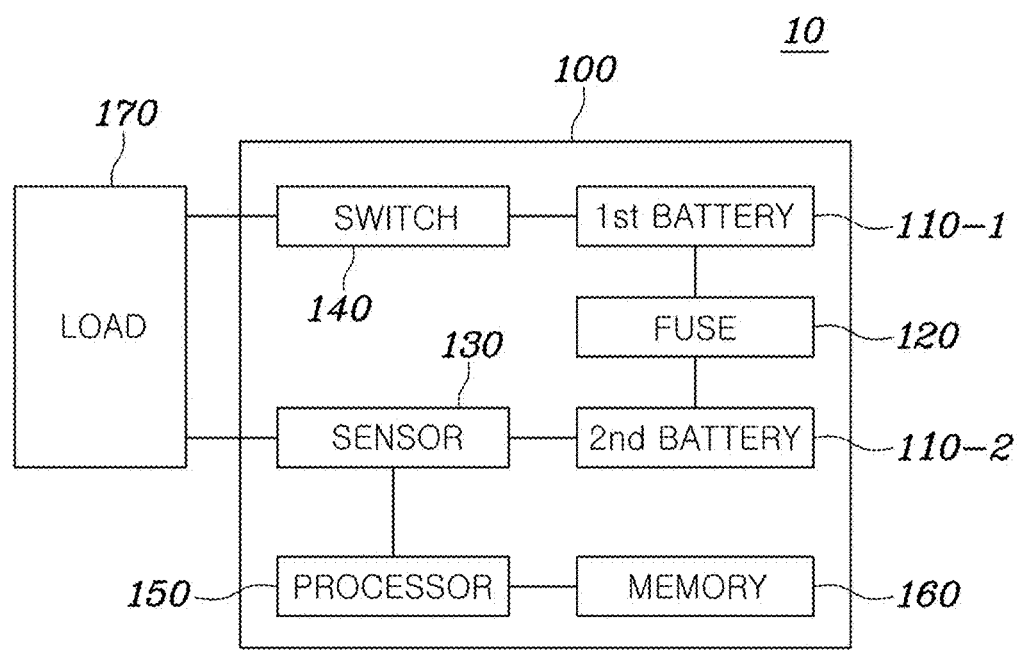
FIG. 1 is a block diagram of a fuse-life expectancy prediction device according to an embodiment of the disclosure.

FIG. 1 is a block diagram of a fuse-life expectancy prediction device according to an embodiment of the disclosure.

A fuse-life expectancy prediction device 100 according to an embodiment of the disclosure may be mounted to the inside of an electric vehicle 10. Referring to FIG. 1, the electric vehicle 10 may include the fuse-life expectancy prediction device 100 and a load 170. Here, the fuse-life expectancy prediction device 100 of the electric vehicle 10 may include one or more batteries (a first battery 110-1 and a second battery 110-2) (hereinafter, referred to as 110), a fuse 120, a sensor 130, a switch 140, a processor 150 and/or a memory 160.

The load 170 may include a driving motor, various electronic components, and the like to powered from the battery 110. The motor of the load 170 may receive the power from the battery 110 as a user controls an accelerator (not shown), and be actuated to drive the electric vehicle 10. The electronic components (e.g., an air conditioner, an audio system, etc.) of the load 170 may be connected to the battery 110 as a user controls a switch, and be thus activated to implement a function desired by the user.

The battery 110 may be configured to supply the power needed for the foregoing operations of the electric vehicle 10. The battery 110 may include any kind of battery, such as a lithium-ion battery, an iron phosphate battery, an all-solid-state battery, etc., as long as the battery can be used in the electronic vehicle 10.

The fuse 120 may be formed in a circuit where the battery 110 is formed, and configured to protect the circuit of the battery 110 by cutting off an overcurrent more than an amount allowable for the circuit of the battery 110. Details of the fuse 120 will be described with reference to FIGS. 2 and 3.

The sensor 130 may be provided in the circuit formed with the battery 110, and configured to detect the amount of current flowing in the battery 110. The sensor 130 may include an ammeter. Information about current detected by the sensor 130 (hereinafter referred to as 'current information') may be output to the processor 150.

The switch 140 may be provided in the circuit provided with the battery 110, and configured to switch over between connection and disconnection of the battery 110 and the load 170. The switch 140 may be switched on and off under the control of the processor 150. In other words, the processor 150 may turn on the switch 140 to connect the battery 110 and the load 170, and turn off the switch 140 to disconnect the battery 110 and the load 170.

The memory 160 refers to an element in which a lookup table, various threshold values, and program instructions are stored for operations of the fuse-life expectancy prediction device 100, and includes a hard disk drive (HDD), a solid-state drive (SSD), and the like memory device. In particular, the memory 160 may be configured to store the program instructions for predicting the life expectancy of the fuse 120 based on the information about current flowing in the circuit of the battery 110 (i.e., the current information) and outputting information corresponding to prediction results under control of the processor 150.

When receiving the current information from the sensor 130, the processor 150 may predict the life expectancy of the fuse 120 by executing the lookup table, the threshold values and/or various program instructions stored in the memory 160. Below, the functions of the program instructions for predicting the life expectancy of the fuse 120, which are executed by the processor 150, will be described in detail.

First, the fuse 120 will be additionally described with reference to FIGS. 2 to 4.

Figure 2:
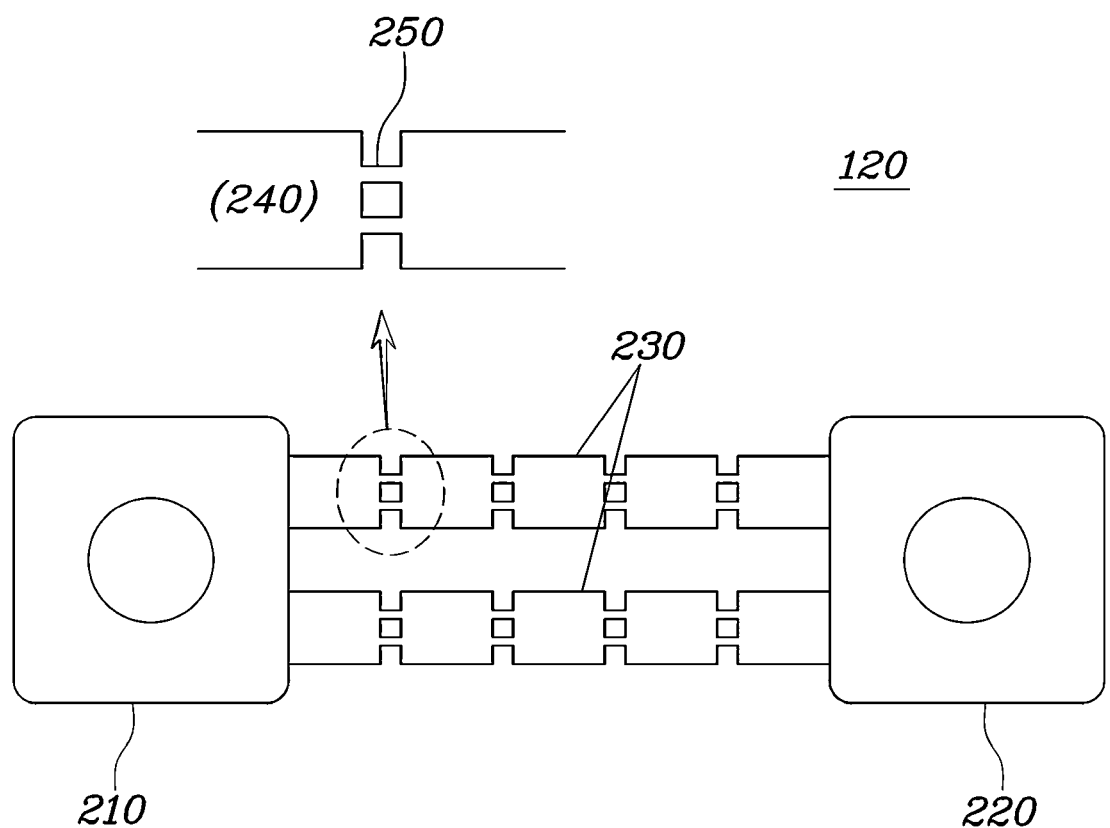
FIG. 2 is a diagram illustrating the shape of a fuse formed in an electric vehicle battery circuit.
Figure 3:
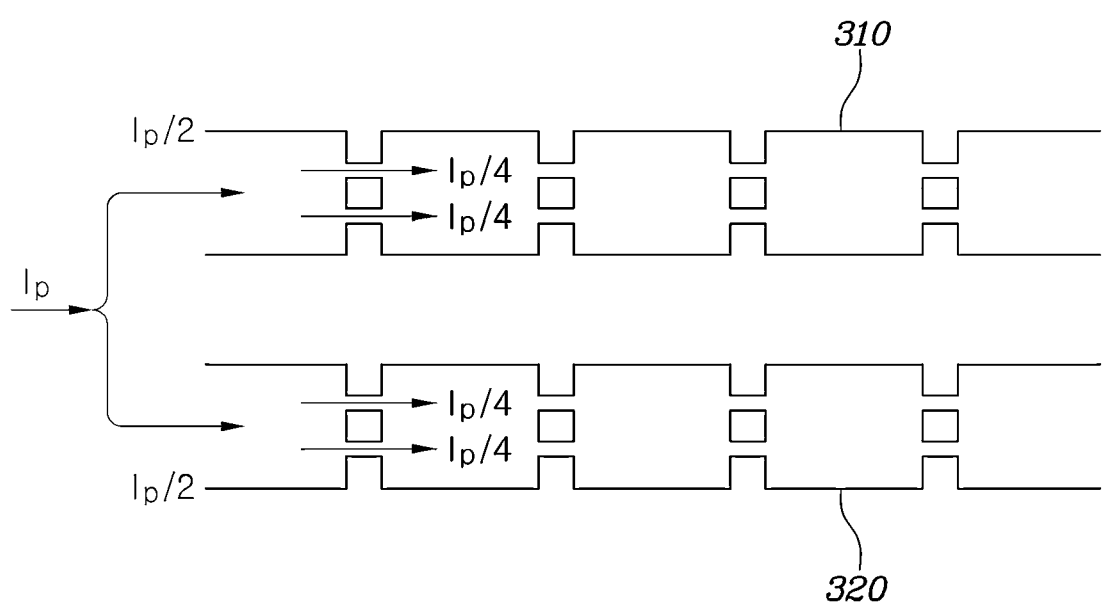
FIG. 3 is a diagram illustrating the amount of current flowing in a fuse formed in an electric vehicle battery circuit.
Figure 4:
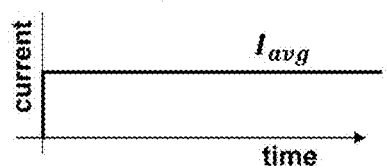
FIG. 4 is a diagram showing simulation results of the exothermic characteristics of the fuse according to patterns of flowing current.
Figure 4:
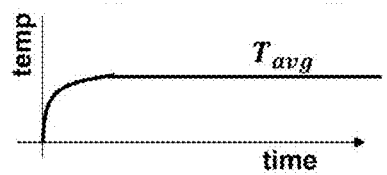
Figure 4:
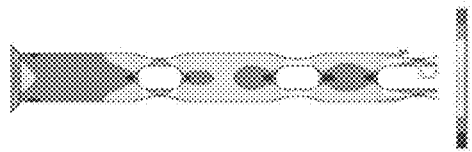
Figure 4:
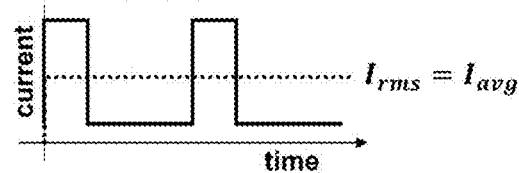
Figure 4:
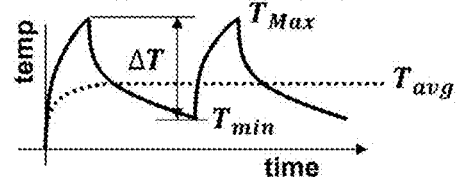
Figure 4:
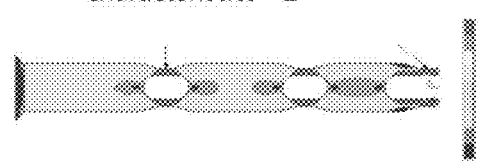

FIG. 2 is a diagram illustrating the shape of a fuse formed in a circuit of an electric vehicle battery circuit, FIG. 3 is a diagram illustrating the amount of current flowing in the fuse formed in the circuit of the electric vehicle battery, and FIG. 4 is a diagram showing simulation results of exothermic characteristics of the fuse according to patterns of flowing current.

Referring to FIG. 2, the fuse 120 may be made of an electric conductor such as copper. Further, the fuse 120 may include input and output terminals 210 and 220 to be physically and electrically connected to the circuit of the battery 110, and one or more elements 230. Current input to the input terminal 210 may diverge and flow through the elements 230, and then converge to be output from the output terminals 220. Ideally, the amount of input current to the input terminal 210 may be equal to the amount of output current from the output terminal 220.

Each element 230 may be formed with a plurality of bodies 240, and a narrow portion 250 connecting the bodies 240. FIG. 2 illustrates that two narrow portions are used for connecting the bodies 240, but it is clear that the number of narrow portions 250 for connecting the bodies 240 may vary as necessary.

Referring to FIG. 3, an input current $I_p$ input to the input terminal 210 may branch by two elements 230. Therefore, a current input to the elements 310 and 320 (hereinafter, referred to as an 'element current') may correspond to half ($I_p/2$) of the input current. Further, the element current may branch by two narrow portions 250. Therefore, a current flowing in the narrow portion 250 (hereinafter referred to as a 'narrow portion current') may correspond to half ($I_p/4$) of the element current.

Referring to FIG. 4, changes in temperature and exothermic characteristics in portions of the fuse 120 are shown when a current flowing in the fuse 120 is a direct current (DC) and when the current is a square wave. According to the types (the DC or the square wave) of current flowing in the fuse 120, a degree of heat generated in the element 230 may be different. In particular, even though the square wave has the same average current level as the DC, heat generated in the narrow portion 250 is more largely varied in the square wave as difference between the highest current level and the lowest current level of the square wave becomes larger. The current flowing in the fuse 120 may correspond to the DC while the electric vehicle 10 is charging, but may correspond to the square wave while the electric vehicle 10 is driving.

Meanwhile, as shown in the following Expression 1, the life expectancy N of the fuse 120 may be decreased as the number of an average temperature $T_{avg}$ and the number of repetitions of temperature change $\Delta T$ in the narrow portion 250 are increased (where, K, n and m are parameters related to the durability of the fuse 120, which may be preset constants.

$$N \propto \frac{K}{(T_{avg})^n (\Delta T)^m} \qquad \text{Expression 1}$$

A relationship between the amount of current flowing in the fuse 120 and heat generated in the narrow portion 250 of the fuse 120 may be experimentally examined in advance. Therefore, the processor 150 may execute the program instructions stored in the memory 160 and generate information about the remaining life expectancy of the fuse 120 based on the current information. Below, it will be described with reference to FIGS. 5 to 9 that the processor 150 generates the information about the life expectancy of the fuse 120.

Figure 5:
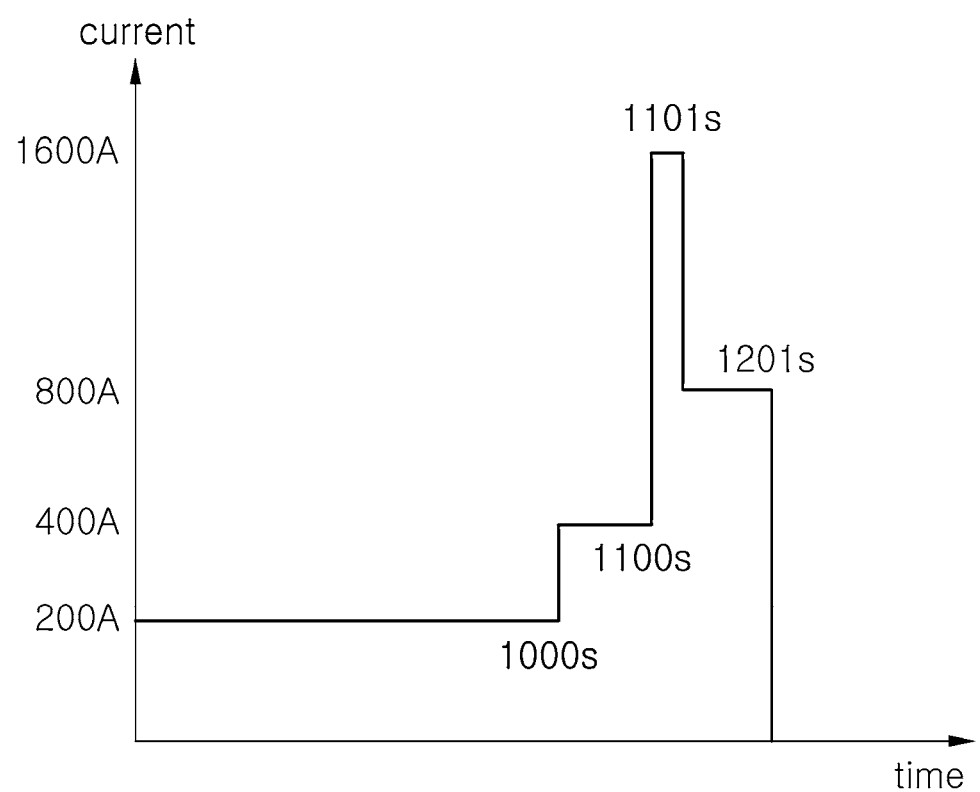
FIG. 5 is a diagram illustrating the amount of current to describe operations of the fuse-life expectancy prediction device according to an embodiment of the disclosure.

FIGS. 5 and 6 are diagrams illustrating the amount of current and a lookup table to describe operations of the fuse-life expectancy prediction device according to an embodiment of the disclosure, and FIG. 7 is a diagram illustrating the lookup table according to an embodiment of the disclosure.

Referring to FIG. 5, the amounts of current flowing in the fuse 120 are as follows.

200 A from 0 sec to 1000 sec
400 A from 1000 sec to 1100 sec
1600 A from 1100 sec to 1101 sec
800 A from 1101 sec to 1201 sec FIG. 6 shows the lookup table where points are tabulated according to the amount of current flowing in the fuse 120 and time. Referring to the lookup table of FIG. 6, deduction points corresponding to the examples of FIG. 5 are as follows.

0 points from 0 sec to 1000 sec
10 points from 1000 sec to 1100 sec
100 points from 1100 sec to 1101 sec
500 points from 1101 sec to 1201 sec When an initial value previously set in the fuse 120 is 1,000,000 points, information corresponding to the fuse 120 after the case of FIG. 5 (hereinafter, referred to as 'fuse-life expectancy information') may be updated into '999,390' (=1,000,000-0-10-100-500) points. Further, when the points to be deducted at quick charging are set to 10 points in advance and the electric vehicle undergoes quick charging after driving, the fuse-life expectancy information may be updated as deducted into 999,380 points.

The lookup table of FIG. 6 may be previously stored in the memory 160. Further, FIG. 6 shows a simplified example, and the amount of current, time, and deduction points corresponding to the amount of current and the time (hereinafter, referred to as deduction information) may be stored in more detail like the lookup table shown in FIG. 7.

Below, it will be described in detail with reference to FIGS. 8 and 9 that the processor 150 executes the program instructions of the memory 160 and generates the fuse-life expectancy information.

Figure 8:
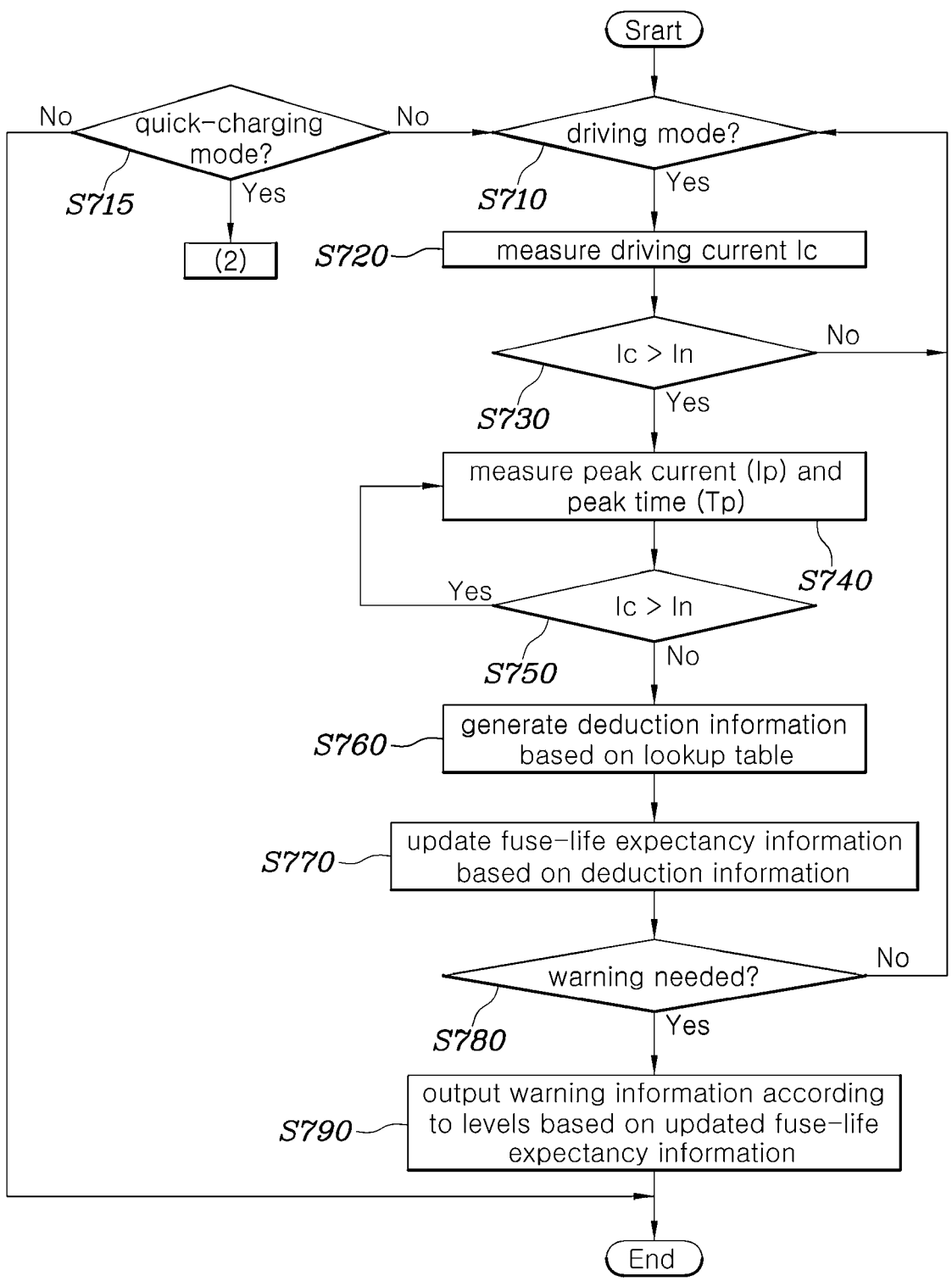
FIG. 8 is a flowchart of a fuse-life expectancy prediction method while driving an electric vehicle.
Figure 9:
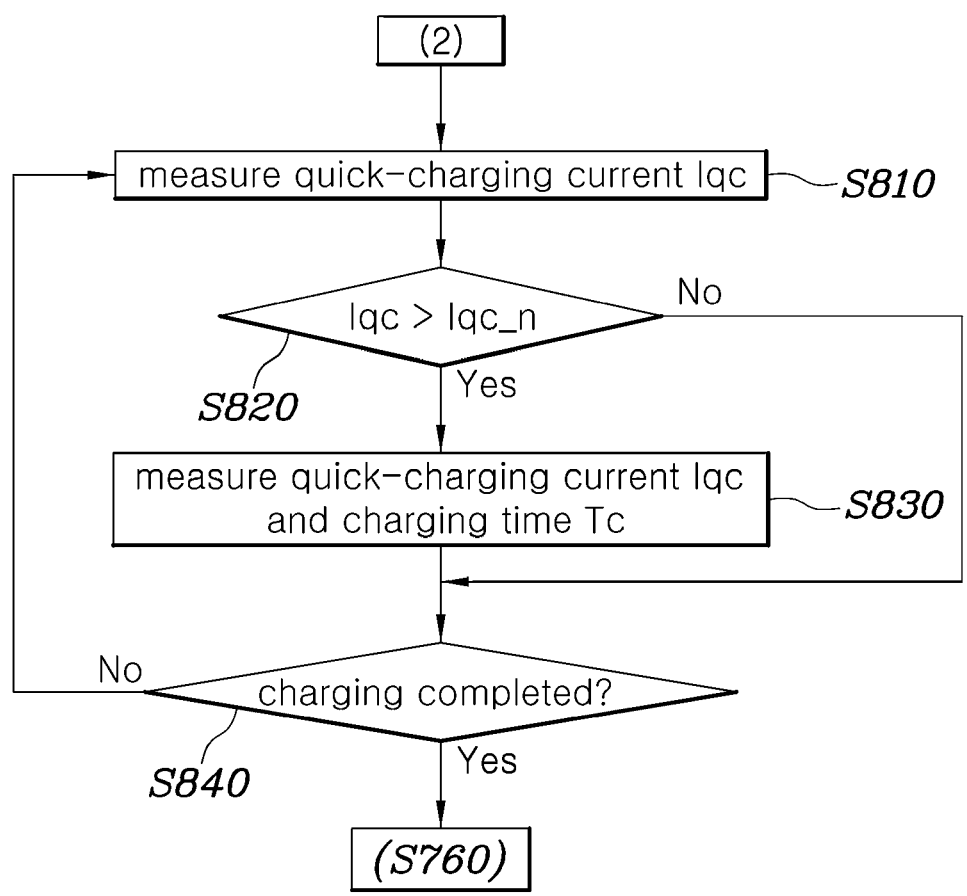
FIG. 9 is a flowchart of a fuse-life expectancy prediction method during the quick charging of an electric vehicle.

FIG. 8 is a flowchart of a fuse-life expectancy prediction method during driving of an electric vehicle, and FIG. 9 is a flowchart of a fuse-life expectancy prediction method during quick charging of an electric vehicle.

The operations to be described below are performed by the processor 150 to execute the program instructions stored in the memory 160, analyze information received from the sensor 130, and generate the fuse-life expectancy information based on the analysis. However, the processor 150 for performing the operations is given by way of example for convenience of understanding and description.

First, referring to FIG. 8, at S710, the processor 150 may identify whether the electric vehicle 10 is driving. For example, the processor 150 may identify that the electric vehicle 10 is driving, based on an activated start of the electric vehicle 10.

When it is identified that the electric vehicle 10 is not driving, the processor 150 may identify whether the electric vehicle 10 is in a quick charging mode at S715. For example, the processor 150 may recognize that the quick charging mode starts when a charging terminal of the electric vehicle 10 is connected to a commercial power source for charging. It will be described later with reference to FIG. 9 that the processor 150 generates the fuse-life expectancy information in the quick charging mode.

When it is identified that the electric vehicle 10 is driving, the processor 150 may measure a driving current Ic at S720. For example, the processor 150 may regard the current information, which is received from the sensor 130 while the electric vehicle is driving, as the driving Ic.

At S730, the processor 150 may compare the driving current Ic and a preset threshold value (hereinafter, referred to as a 'driving threshold value' to be distinguishable from a threshold value of the quick charging mode. This is to identify whether driving current Ic is large enough to deteriorate the fuse 120.

At S740 and S750, the processor 150 may measure a peak current Ip and/or a peak time Tp corresponding to the driving current Ic when the driving current Ic exceeds the driving threshold value. While the electric vehicle 10 is driving, the value of current flowing in the fuse 120 may vary as time passes. Therefore, the processor 150 may cumulatively measure the peak current Ip and/or the peak time Tp of the driving current Ic.

For example, the processor 150 may measure the values of the driving current Ic (i.e., the peak current Ip) exceeding the driving threshold value, and excessive time (i.e., the peak time Tp). Then, the processor 150 calculates an average value or a root mean square (RMS) value during the peak time of the measured peak current when the driving current Ic is lower than or equal to the driving threshold value.

At S760, the processor 150 may look up the deduction information from the lookup table stored in the memory 160 based on the cumulatively measured peak current Ip and/or the peak time Tp. For example, it will be assumed that the lookup table stored in the memory 160 is equivalent to that shown in FIG. 7. Further, it will be assumed that the RMS value is 600 [A] and the peak time is 10 [sec] during the peak time of the peak current. In this case, the processor 150 may look up 1,000 [points] as the deduction information.

At S770, the processor 150 may update the fuse-life expectancy information by deducting the deduction information the fuse-life expectancy information stored in the memory 160.

At S780, the processor 150 may identify whether a warning is necessary for the updated fuse-life expectancy information. For example, the processor 150 may identify that the warning is needed when the fuse-life expectancy information is lower than or equal to a preset warning threshold value (e.g., 100,000 [points]).

At S790, when it is identified that the warning is needed for the updated fuse-life expectancy information, the processor 150 may detect a level of the fuse-life expectancy information, and output a warning corresponding to the detected level. For example, let a first level range from 100,000 [points] to 50,000 [points], a second level range from 50,000 [points] to 20,000 [points], and a third level be lower than 20,000 [points]. In this case, the processor 150 detects the level of the updated fuse-life expectancy information. Then, the processor 150 outputs a warning corresponding to the detected level. Examples of warnings corresponding to the levels may be as follows.

In the first level, the replacement of the fuse is imminent
In the second level, the fuse should be replaced
In the third level, no replacement of the fuse may cause the disconnection from the battery without any warning.

Meanwhile, referring to FIG. 8, at S810, the processor 150 may measure a quick charging current Iqc in the quick charging mode of the electric vehicle 10. For example, the processor 150 may regard the current information received from the sensor 130 in the quick charging mode of the electric vehicle 10, as the quick charging current Iqc. In the quick charging mode, a certain amount of current may flow in the fuse 120. Of course, the amount of current flowing in the fuse 120 may vary sharply at the beginning of the quick charging, but it is merely a very short moment. Further, when the voltage of the battery 110 reaches a certain level or higher due to quick charging, the current flowing in the fuse 120 may vary. Even in this case, the current may change sharply for a short moment only at the beginning of change. Therefore, the processor 150 does not need to separately measure the peak voltage and the peak time in the quick charging mode unlike the driving mode.

In other words, at S820, the processor 150 may compare the quick charging current Iqc and a preset threshold value (hereinafter, referred to as 'quick charging threshold value Iqc_n'). Further, at S830, the processor 150 measure the quick charging current and the charging time Tc when the quick charging current Iqc exceeds the quick charging threshold value Iqc_n. Thus, the processor 150 can identify how much and how long the current has flowed in the fuse 120 during the quick charging.

At S840, the processor 150 may look up the deduction information corresponding to the measured quick charging current and the charging time Tc from the previously-stored lookup table when the quick charging is completed. The subsequent operations are the same as those after S760 described with reference to FIG. 8, and thus repetitive descriptions thereof will be avoided.

As described above, the fuse-life expectancy prediction device 100 according to an embodiment of the disclosure can predict the life expectancy of the fuse 120, which is formed in the circuit of the battery 110 in the electric vehicle 10, based on the amount and time of current flowing in the fuse 120. Further, the fuse-life expectancy prediction device 100 according to an embodiment of the disclosure allows a user to replace the fuse before the fuse reaches the end of its life expectancy, thereby preventing problems that may occur as the fuse blows out in a normal operating situation.

According to the disclosure, there are provided a device and method for predicting the life expectancy of the fuse formed in the battery circuit of the electric vehicle.

Further, according to the disclosure, a user can replace the fuse before the fuse reaches the end of its life expectancy to prevent problems that may occur as the fuse blows out in a normal operating situation, and the fuse having not excessive but proper performance is used to keep the driving of the vehicle economical and safe.

Although a few embodiments of the disclosure have been described in detail, the disclosure is not limited to these embodiments and various changes and modifications can be made by a person having ordinary knowledge in the art without departing from the technical ideas and scope of the disclosure.

The invention claimed is:

1. A device for predicting a life expectancy of a fuse for a battery comprising a first battery and a second battery of an electric vehicle, the device comprising:
   a processor;
   a sensor configured to generate and output current information about current flowing in the fuse to the processor, wherein the fuse is disposed between the first battery and the second battery; and
   a memory connected to the processor and configured to store a preset lookup table;
   wherein the memory is configured to store program instructions which are executable by the processor to generate fuse-life expectancy information corresponding to the fuse based on the preset lookup table and time corresponding to an excess when the current information exceeds a preset threshold value.

2. The device according to claim 1, wherein, when the current information is driving current information,
   the memory is configured to store program instructions for generating the fuse-life expectancy information based on a preset method by measuring a peak current and a peak time corresponding to the driving current information when the driving current information exceeds a preset driving threshold value, and
   the preset threshold value is the preset driving threshold value.

3. The device according to claim 2, wherein
   the memory is configured to store program instructions for cumulatively measuring the peak current and the peak time until the driving current information is lower than or equal to the preset driving threshold value, and generating the fuse-life expectancy information by looking up information corresponding to the cumulatively measured peak current and peak time from the preset lookup table.

4. The device according to claim 1, wherein, when the current information is quick-charging current information,
   the memory is configured to store program instructions for generating a quick-charging absolute current value corresponding to the quick-charging current information, and generating the fuse-life expectancy information based on a preset method by measuring a quick-charging current information and charging time when the quick-charging absolute current value exceeds a preset quick-charging threshold value, and
   the preset threshold value is an absolute value of the quick-charging current value.

5. The device according to claim 4, wherein the memory is configured to store program instructions for cumulatively measuring the quick-charging current information and the charging time until the quick charging is completed, and generating the fuse-life expectancy information by looking up information corresponding to the cumulatively measured quick-charging current information and charging time from the preset lookup table.

6. The device according to claim 1, wherein the memory is configured to further store program instructions for outputting a preset warning when the fuse-life expectancy information is lower than or equal to a preset warning reference.

7. The device according to claim 6, wherein the memory is configured to store program instructions for detecting a warning level of the fuse-life expectancy information, and outputting a warning corresponding to the warning level.

8. A method of predicting a life expectancy of a fuse used for a battery comprising a first battery and a second battery of an electric vehicle, the method comprising:
   generating information about current flowing in the fuse disposed between the first battery and the second battery;
   comparing the current information with a preset threshold value; and
   generating fuse-life expectancy information corresponding to the fuse based on a lookup table previously stored in a provided memory and time corresponding to an excess when the current information exceeds the threshold value.

9. The method according to claim 8, wherein, when the current information is driving current information,
   generating the fuse-life expectancy information comprises:
   measuring a peak current and a peak time corresponding to the driving current information when the driving current information exceeds a preset driving threshold value; and
   generating the fuse-life expectancy information based on a preset method using the peak current and the peak time;
   wherein the threshold value is the driving threshold value.

10. The method according to claim 9, wherein generating the fuse-life expectancy information comprises:
    cumulatively measuring the peak current and the peak time until the driving current information is lower than or equal to the driving threshold value; and
    generating the fuse-life expectancy information by looking up information corresponding to the cumulatively measured peak current and peak time from the lookup table.

11. The method according to claim 8, wherein, when the current information is quick-charging current information,
    generating the fuse-life expectancy information comprises:

generating a quick-charging absolute current value corresponding to the quick-charging current information; and generating the fuse-life expectancy information based on a preset method by measuring a quick-charging current information and charging time when the quick-charging absolute current value exceeds a preset quick-charging threshold value;

wherein the threshold value is the quick-charging absolute current value.

12. The method according to claim 11, wherein generating the fuse-life expectancy information further comprises:

cumulatively measuring the quick-charging current information and the charging time until the quick charging is completed; and generating the fuse-life expectancy information by looking up information corresponding to the cumulatively measured quick-charging current information and charging time from the lookup table.

13. The method according to claim 8, further comprising outputting a preset warning when the fuse-life expectancy information is lower than or equal to a preset warning reference.

14. The method according to claim 13, wherein outputting the warning comprises:

detecting a warning level of the fuse-life expectancy information; and outputting a warning corresponding to the warning level.

* * * * *